United States Patent [19]

Bower

[11] Patent Number: 4,803,176
[45] Date of Patent: Feb. 7, 1989

[54] INTEGRATED CIRCUIT STRUCTURE WITH ACTIVE DEVICE IN MERGED SLOT AND METHOD OF MAKING SAME

[75] Inventor: Robert W. Bower, Maui, Hi.

[73] Assignee: Advanced Micro Devices, Inc., Sunnyvale, Calif.

[21] Appl. No.: 897,678

[22] Filed: Aug. 18, 1986

Related U.S. Application Data

[63] Continuation-in-part of Ser. No. 576,659, Feb. 3, 1984, abandoned.

[51] Int. Cl.$^4$ ..................... H01L 29/70; H01L 29/78
[52] U.S. Cl. ....................... 437/33; 437/40; 437/67; 437/72; 437/228; 357/55
[58] Field of Search ............... 148/DIG. 10, DIG. 11, 148/DIG. 53; 357/55; 437/31, 32, 33, 40, 67, 72, 228

[56] References Cited

U.S. PATENT DOCUMENTS

| | | | |
|---|---|---|---|
| 3,681,668 | 8/1972 | Kobayashi | 357/59 |
| 3,703,420 | 11/1972 | Vora | 357/35 |
| 3,762,966 | 10/1973 | Engeler et al. | 357/36 |
| 4,062,034 | 12/1977 | Matsushita et al. | 357/16 |
| 4,104,086 | 8/1978 | Bondur et al. | 357/50 |
| 4,139,442 | 2/1979 | Bondur et al. | 357/50 |
| 4,302,763 | 11/1981 | Ohuchi et al. | 357/59 |
| 4,339,767 | 7/1982 | Horng et al. | 357/44 |
| 4,392,149 | 7/1983 | Horng et al. | 357/59 |
| 4,419,150 | 12/1983 | Soclof | 357/35 |
| 4,484,211 | 11/1984 | Takemoto et al. | 357/50 |
| 4,663,831 | 5/1987 | Birrittella et al. | 29/576 E |

FOREIGN PATENT DOCUMENTS

| | | | |
|---|---|---|---|
| 0068072 | 5/1983 | European Pat. Off. | 357/50 |
| 3400295 | 12/1984 | Fed. Rep. of Germany | |
| 54-116884 | 9/1979 | Japan | 357/50 |
| 57-11150 | 3/1982 | Japan | 357/50 |
| 57-201070 | 9/1982 | Japan | 357/50 |

OTHER PUBLICATIONS

Magdo et al., "Fabricating Complementary Transistors" IBM Tech. Disc. Bull., vol. 15 (1972) pp. 2294–2295.

Barbee et al., "All Ion–Implant Bipolar Transistor Process", IBM Tech. Disc. Bull., vol. 24 (1981), pp. 3409–3412.

Lillja et al., "Process for Fabrication of Shallow and Deep Silicon Dioxide Filled Trenches", IBM Technical Disclosure Bulletin, vol. 22, No. 11, Apr. 1980, pp. 4900–4902.

Wang et al., "Reactive–Ion Etching Eases Restrictions on Materials and Feature Sizes", Electronics, Nov. 3, 1983, pp. 157–161.

Minegishi et al., "A Sub–Micron CMOS Megabit Level Dynamic Ram Technology Using a Doped Face Trench Capacitor Cell", Proceedings, IEDM, 1983, pp. 319–322.

Morie et al., "Depletion Trench Capacitor Technology for Megabit Level MOS dRAM", IEEE EDL, vol. EDL-4, No. 11, Nov. 1983, pp. 411–413.

Primary Examiner—Olik Chaudhuri
Attorney, Agent, or Firm—Patrick T. King; John P. Taylor; J. Vincent Tortolano

[57] ABSTRACT

An improved integrated circuit structure is disclosed in which an active device is formed in contiguous portions of a single slot in an integrated circuit structure or substrate. The method of forming the single slot or merged slot device comprises forming a first portion of the slot, constructing at least a part of one element of the active device in this slot portion, and then forming one or more additional slot portions contiguous with the first slot portion, and constructing one or more further elements of the same active device in the additional contiguous slot portion or portions.

21 Claims, 9 Drawing Sheets

INTEGRATED CIRCUIT STRUCTURE WITH ACTIVE DEVICE IN MERGED SLOT AND METHOD OF MAKING SAME

CROSS-REFERENCE TO RELATED APPLICATIONS

This application is a continuation-in-part of Bower U.S. Pat. application Ser. No. 576,659, filed Feb. 3, 1984, now abandoned.

BACKGROUND OF THE INVENTION

1. Field of the Invention This invention relates to integrated circuit structures. More particularly, this invention relates to an integrated circuit structure wherein all of the elements of an active device are located in a common slot formed in the structure.

2. Description of the Related Art

Advances in lithography have permitted line width resolution to reach micron dimensions and processing techniques have improved to the point where the reliable formation of thin films and precise etching are both possible so that smaller and more predictable feature sizes can be obtained. As a consequence, the lateral dimensions of devices are reaching micron levels and passing on into nanometer ranges resulting in a continued decrease in the ensuing density of integrated circuits.

Thus, a greater number of individual devices can be fabricated in a given area. While further increases in areal density are likely, physical, equipment, and process limits are being approached. In addition, as devices become smaller and smaller, their power ratings are reduced and the relative importance of problems such as parasitic capacitance and contamination is increased. Due to the diminishing return to be obtained from further efforts to improve areal density, it has become desirable to consider the possibility of increasing the extent of the active regions in the vertical dimension to thereby obtain performance for a device with established lateral dimensions which is equivalent to the performance of a device with greater lateral dimensions. Also higher power or higher performance devices may be obtained in this way.

As the densities of integrated circuits have increased, there has been serious consideration of using trench or slot formation processes for forming the insulating zones between individual transistors. Such an isolation technique is described in Bondur et al U.S. Pat. No. 4,104,086. This isolation technique is also described in Bonn U.S. Pat. No. 4,626,317 and Gwozdz U.S. Pat. No. 4,714,520 both of which applications are assigned to the assignee of this application.

In addition to forming slots in semiconductor wafers for isolating individual devices, slots have also been considered for use as passive circuit elements. For example, it has been proposed that a slot be filled with an appropriate material so that it will function as a capacitor. See, e.g., K. Minegishi et al ., "A Sub-Micron CMOS Megabit Level Dynamic RAM Technology Using a Doped Face Trench Capacitor Cell", *Proceedings*, IEDM, 1983, p. 319; and T. Morie et al., "Depletion Trench Capacitor Technology for Megabit Level MOSdRAM", *IEEE Electron Device Letters*, v. EDL-4, No. 11, p. 411, Nov. 1983. Such applications are possible because, with appropriate filling materials, a slot can be made to be conductive or insulating as required.

It has also been proposed to construct active devices in slots in a substrate. Fujitsu Japanese Patent Document No. 57-11150 discloses construction of a lateral bipolar transistor wherein an emitter region is formed by diffusing impurities into the walls of a slot formed in a substrate. A collector region is similarly formed using a second slot formed in the substrate near the first slot. The substrate portion between the emitter region slot and the collector region slot is said to form the base of the transistor.

In parent application Ser. No. 576,659, assigned to the assignee of this invention and cross-reference to which is hereby made, there is described and claimed the construction of a bipolar transistor using slots in a substrate wherein a base region is first formed in the substrate walls and bottom of a first slot which is then filled with a substance which will form an emitter in the first slot. This provides a self-aligned structure with a large base-emitter surface junction. A second slot, providing a collector contact region, is formed in the substrate in alignment with, but spaced from, the emitter slot. A buried collector layer, located beneath the portion of the base region formed in the substrate beneath the emitter slot, communicates with the collector contact region.

Such a construction results in a high performance device having lower collector-to-base and collector-to-substrate capacitances due to the respective relationships between the physical collector and base regions and the active collector and base regions.

In a copending application Serial No. 897,686, entitled "VERTICAL SLOT BOTTOM BIPOLAR TRANSISTOR DEVICE", filed on Aug. 18, 1986 and assigned to the assignee of this invention, there is described and claimed a modification of the aforementioned Ser. No. 576,659 in which the active base and collector regions are both formed beneath the emitter in the emitter slot.

Such constructions of an active device in slots beneath the surface of a substrate or integrated circuit structure makes it possible to increase the extent of the active regions of the active device in the vertical dimension to thereby obtain performance for a device with established lateral dimensions which is equivalent to the performance of a device with greater lateral dimensions as discussed above. Alternatively, construction of higher power or higher performance devices is also made possible without incurring lateral dimension restraints.

It would, however, be advantageous, both from a standpoint of processing and performance, to construct an active device in a single or merged slot in an integrated circuit structure.

SUMMARY OF THE INVENTION

It is, therefore, an object of this invention to provide an improved integrated circuit structure with an active device formed in a single slot in the structure or substrate. It is another object of this invention to provide a method for forming an improved integrated circuit structure with an active device formed in a single slot in the structure or substrate.

It is yet another object of this invention to provide a method for forming an improved integrated circuit structure with an active device formed in a single slot in the structure or substrate which comprises forming a first portion of the slot, constructing at least a part of one element of the active device in the first slot portion, and then forming one or more additional slot portions contiguous with the first slot portion, and constructing one or more further elements of the same active device in the additional contiguous slot portion or portions.

It is a further object of the invention to provide methods for the construction of particular integrated circuit devices in a single slot formed in an integrated circuit structure or substrate.

These and other objects of the invention will be apparent from the following description and accompanying drawings.

DESCRIPTION OF THE PREFERRED EMBODIMENTS

The invention provides for the construction of the elements or electrodes of an active device such as a bipolar transistor or an MOS transistor in a single slot which is formed in contiguous segments or portions which merge together to form a single slot which may be termed a merged slot.

The merged slot device of the invention is constructed in a slot which may be formed by etching techniques in a semiconductor substrate such as a silicon substrate prior to the formation of any other structure thereon, i.e., in the wafer itself. Alternatively, the slot in which the device will be constructed may be formed after conventional formation of a doped layer on the wafer followed by epitaxial growth of a further semiconductor layer to thereby provide a buried layer as is well known to those skilled in the art.

Therefore, the term "substrate", as used herein, is intended to refer to the semiconductor structure in which the slot will be formed, either prior to the formation of any other layers thereon, or after the formation of underlying structure such as, for example, a buried layer, wherein the depth of the subsequently formed slot will not interfere with the intended function of such underlying structure.

Figure 1:
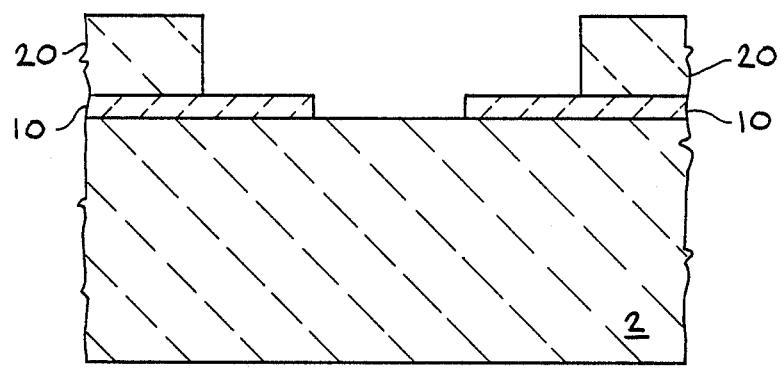
FIG. 1 is a fragmentary vertical cross-section view of a first step in the construction of a first embodiment of the invention.

Referring now to FIGS. 1-11, the construction of a merged slot MOS device formed in accordance with the invention is illustrated as formed in a silicon substrate. In FIG. 1, a nitride mask 10, defining the gate electrode or element, has been applied over a substrate 2 and an oversize oxide mask 20, defining the entire active device, including gate, source, and drain, has been formed over nitride mask 10.

Figure 2:
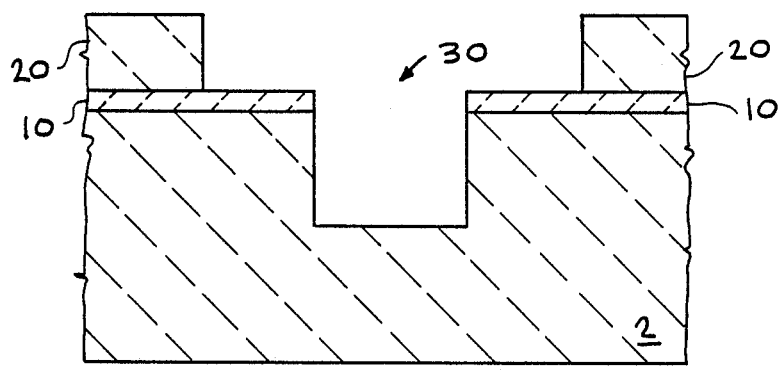
FIGS. 2-4 are fragmentary vertical cross-section views of subsequent steps in the construction of the first embodiment of the invention.
Figure 3:
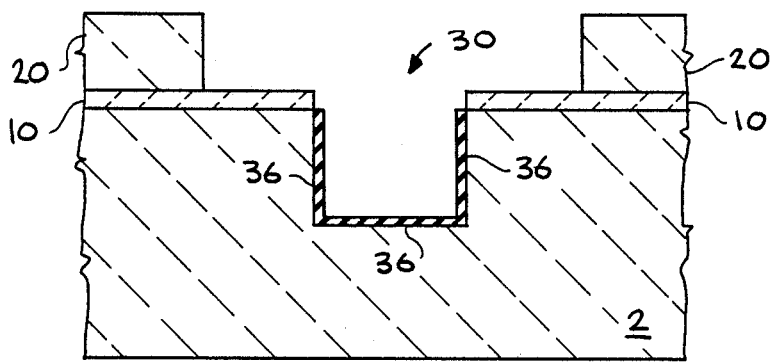

Using both the nitride and oxide masks, a first portion of the slot is formed in substrate 2, for example, by etching substrate 2 with an anisotropic etch, to form first slot portion 30 as shown in FIG. 2. The walls and bottom of slot portion 30 are then covered with an insulating material 36 such as an oxide or a nitride, but preferably an oxide, to form a gate oxide which will insulate the to-be-formed gate electrode from the channel and the source and drain electrodes which will be formed in slot portions contiguous to slot portion 30.

Figure 4:
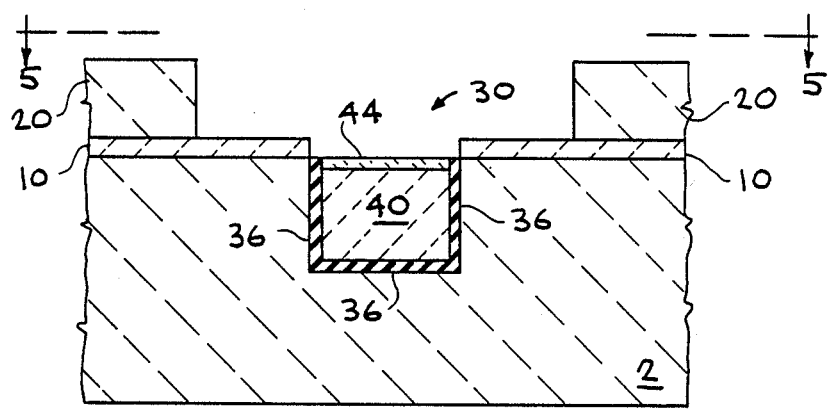
Figure 5:
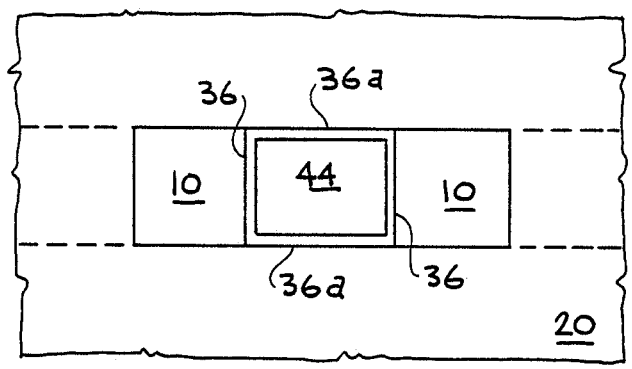
FIG. 5 is a top view of the structure shown in FIG. 4 taken along lines 5—5.

After forming slot portion 30 and forming insulation layer 36 therein, slot 30 is filled with a semiconductor material, such as an appropriately doped polysilicon, to form gate electrode element 40 as shown in FIGS. 4 and 5. An oxide cap 44 is then formed over electrode 40 which will function as an etch block as will be described below.

Figure 6:
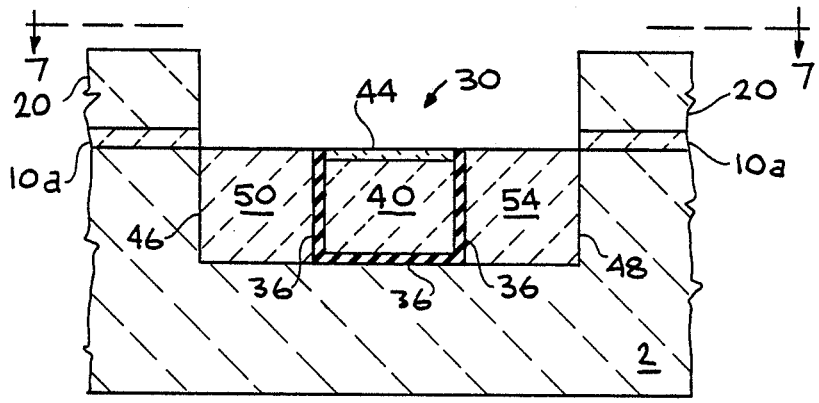
FIG. 6 is a fragmentary vertical cross-section view of a subsequent step in the construction of the first embodiment of the invention.

After formation of gate electrode element 40 and the oxide cap 44 thereover, nitride portions 10 are removed, for example by selective etching leaving nitride layer segments 10a beneath oxide mask 20. Source slot portion 46 and drain slot portion 48 are then formed in the underlying exposed segment of substrate 2 contiguous to slot portion 30 as shown in FIG. 6. Slot portions 46 and 48 may be simultaneously formed in substrate 2 by etching with a selective silicon etchant which will not attack the adjacent oxide mask 20 nor the protective oxide cap 44 over gate electrode 40.

Figure 7:
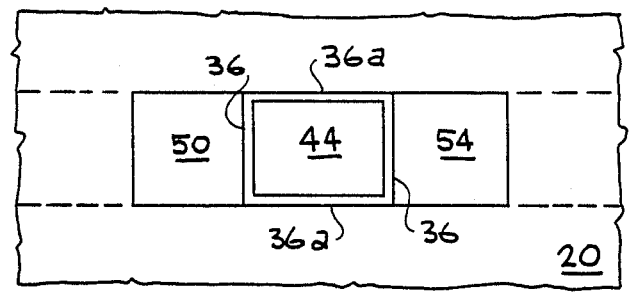
FIG. 7 is a top view of the structure shown in Figure taken along lines 7—7.

Source slot portion 46 and drain slot portion 48 are then filled with a semiconductor material such as appropriately doped polysilicon to form the source electrode 50 and drain electrode 54 as shown in FIGS. 6 and 7. The portions of insulation layer 36 which abut source electrode 50 and drain electrode 54 now serve to insulate the source and drain electrodes from gate electrode 40 formed in slot portion 30 contiguous to slot portions 46 and slot portion 48.

Figure 8:
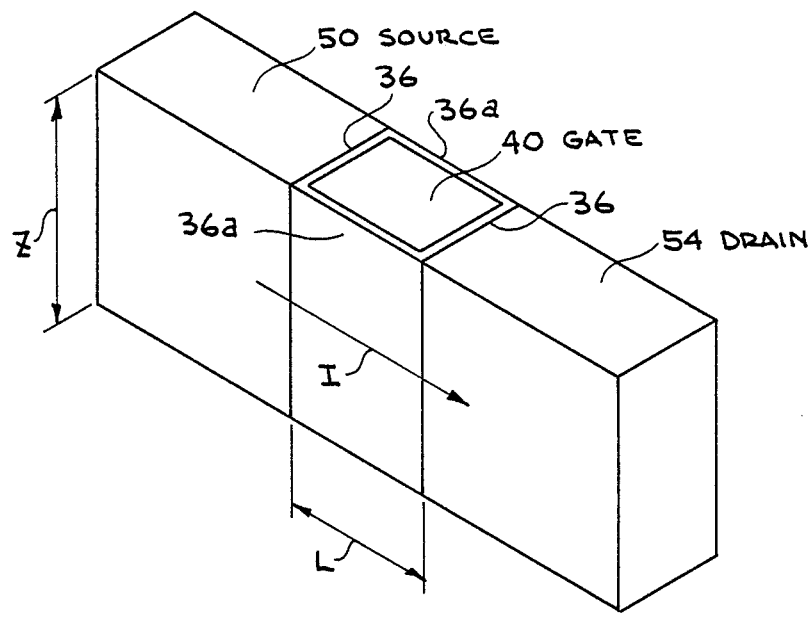
FIG. 8 is an isometric view of the first embodiment of the invention.

The segments of oxide layer 36 on the sidewalls of slot portion 30 which are not contiguous to slot portions 46 and 48, denoted in FIGS. 5, 7, and 8 as 36a, form the gate oxide which separates gate electrode 40 from channels 58 formed in substrate 2 between source electrode 50 and drain electrode 54. (See FIG. 11)

As is well known to those skilled in the art, the current which will flow through the channel in an MOS device is given by $I=Z/L(kV_{gs}^2)$ where L is length of the channel or distance between the source and drain electrodes and Z is the width of the device.

It will be noted in FIG. 8, however, that Z represents the depth of the source, gate, and drain electrodes, i.e., the depth of the contiguously formed slot portions 46, 30, and 48 rather than the width of the device as in conventionally formed MOS devices. Thus, to increase the current by increasing component Z in the equation, the depth (not the width) of the contiguously formed slot portions is advantageously increased. Thus, the current capability of the device may be increased without increasing the lateral area of the device on the integrated circuit structure or chip.

Figure 9:
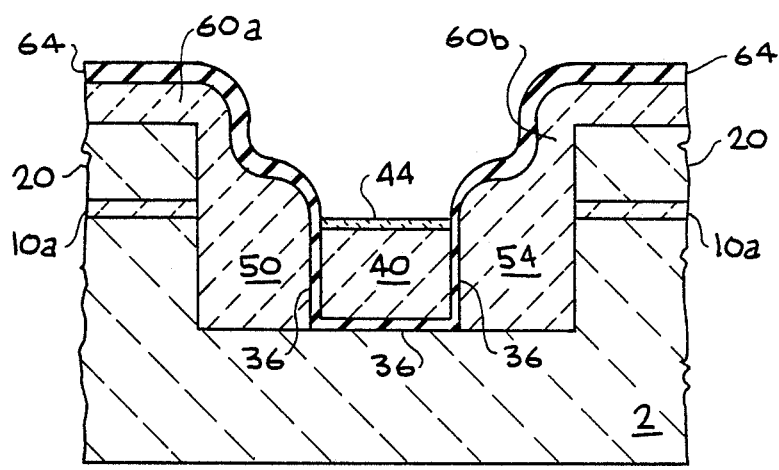
FIG. 9 is a fragmentary vertical cross-section view of one of the final steps in the construction of the first embodiment of the invention.

As shown in FIG. 9, a further layer of conductive material such as doped polysilicon may then be applied and patterned to form polysilicon segments 60a and 60b to respectively connect source 50 and drain 54 to external contacts which form no part of this invention. A protective insulating layer 64, which may conveniently comprise an oxide layer, may then be formed over conductive segments 60a and 60b.

Figure 10:
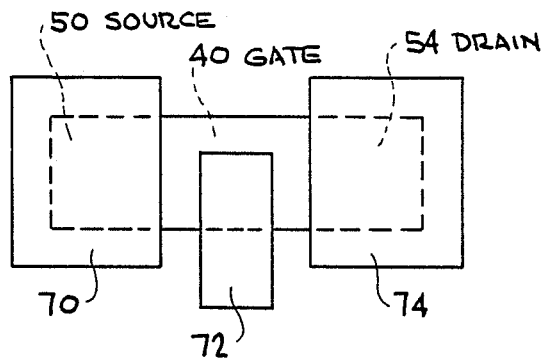
FIG. 10 is a top view of the first embodiment of the invention.

Finally, as shown in FIG. 10, a source contact 70, a gate contact 72, and a drain contact 74 may be respectively formed in a conventional manner over source electrode 50, gate electrode 40 and drain electrode 54.

Temperature treatments suitable for annealing and rendering electrically active doped polysilicon may be employed after the polysilicon deposition steps. Additionally, other doped regions may be formed at various appropriate points in the processing to complement the slot filled regions. These additional doped regions may be followed by anneals and/or drives where required to produce the desired junction characteristics and electrical activity.

Figure 11:
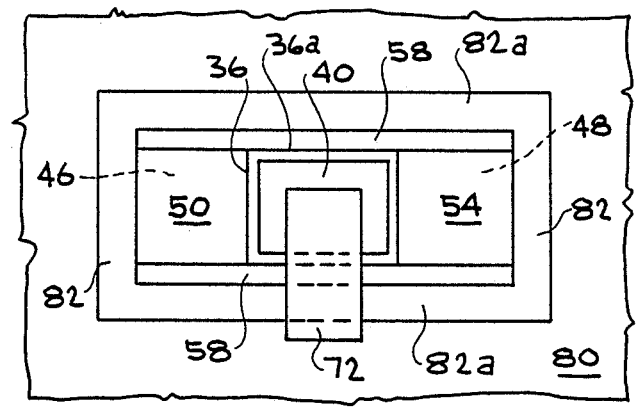
FIG. 11 is a top view of a modification of the first embodiment of the invention.

FIG. 11 illustrates an alternate embodiment (with source contact 70 and drain contact 74 omitted for clarity) in which the device of the invention is constructed within a surrounding isolation slot 80 wherein the oxide sidewall segments 82 of isolation slot 80 facing the ends of the active device are common to the end walls of contiguous slot portions 46, and 48. Isolation oxide segments 82a are, however, spaced from the sides of contiguous slot portions 30, 46, and 48 to define channel regions 58 in the substrate. The provisions of such oxide isolation surrounding and directly abutting the outwardly facing regions of the MOS device, including channels 58, minimize end effects as discussed in copending U.S. Pat. No. 897,685, entitled "WALLED SLOT DEVICES AND, METHOD OF MAKING SAME", filed on Aug. 18, 1986 and assigned to the assignee of this invention.

Turning now to FIGS. 12-21, construction of a merged slot bipolar transistor in an integrated circuit structure in accordance with the invention is illustrated.

Figure 13:
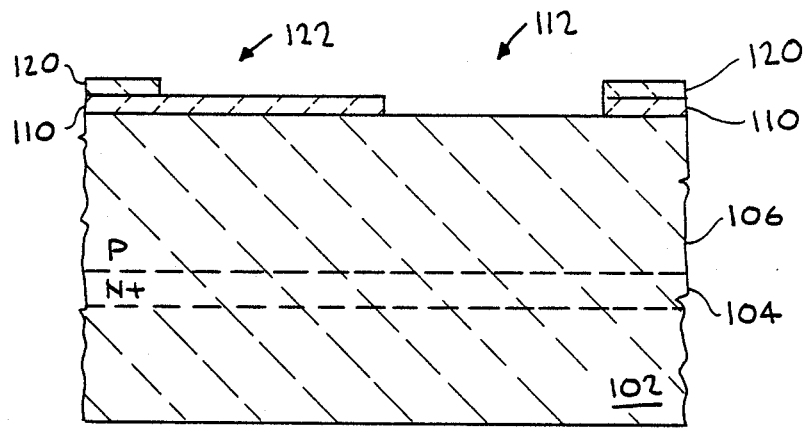
FIG. 13 is a fragmentary vertical cross-sectional view of the structure of FIG. 12.

Referring particularly to FIG. 13, an N+layer 104, which will eventually form a buried layer for connection to a collector contact, is first formed in the surface of a semiconductor substrate 102, which may comprise silicon. A further P doped layer 106 of epitaxial material, i.e., epitaxial silicon is then formed over layer 104. For convenience, substrate 102, buried layer 104, and epitaxial layer 106 will sometimes be referred to below conjointly as the substrate when describing the formation of the merged slot device therein.

Figure 12:
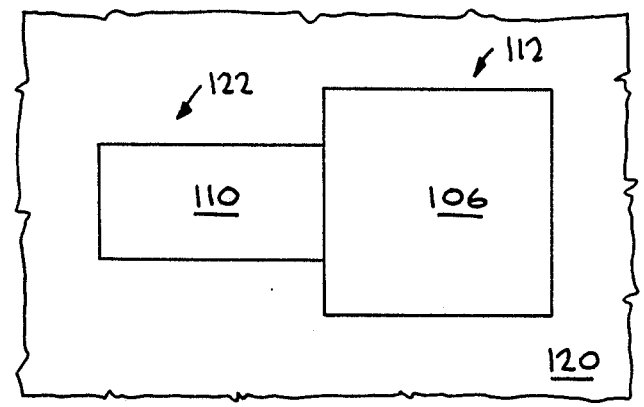
FIG. 12 is a top view showing the initial structure in the construction of the second embodiment of the invention.

A nitride mask layer 110 is then formed over layer 106, defining an opening 112, as shown in both FIGS. 12 and 13, for formation of a first slot portion as will be described. An oxide layer 120 forms a second and larger mask over nitride mask 110 defining an opening which encompasses not only opening 112 but an additional area 122 as well which defines a further opening for formation of a second slot portion the construction of which will also be described below.

Figure 14:
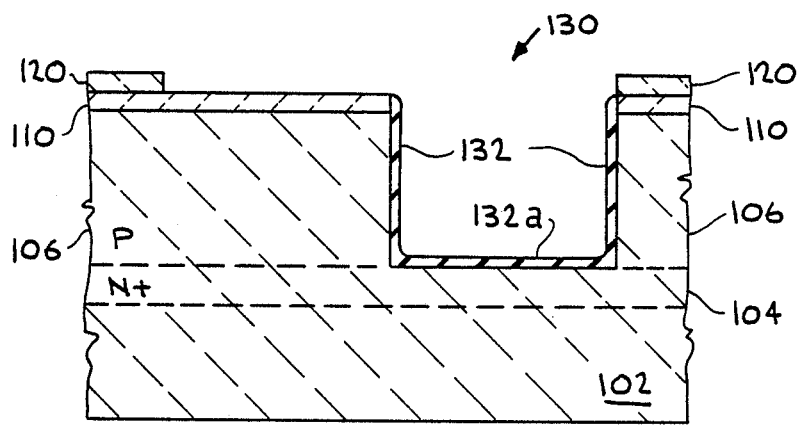
FIGS. 14 and 15 are fragmentary vertical cross-sectional views of subsequent processing steps in the construction of the second embodiment of the invention.

In FIG. 14, a first slot portion 130 has been formed, for example by etching, through the opening 112 in oxide mask 120 and nitride mask 110. The depth of slot 130 in the substrate is controlled to extend slot 130 down to the level of buried layer 104. The sidewalls and bottom of slot 130 are then oxidized, as shown respectively at 132 and 132a, to form the eventual insulation or isolation from the adjoining portion of the merged slot.

Figure 15:
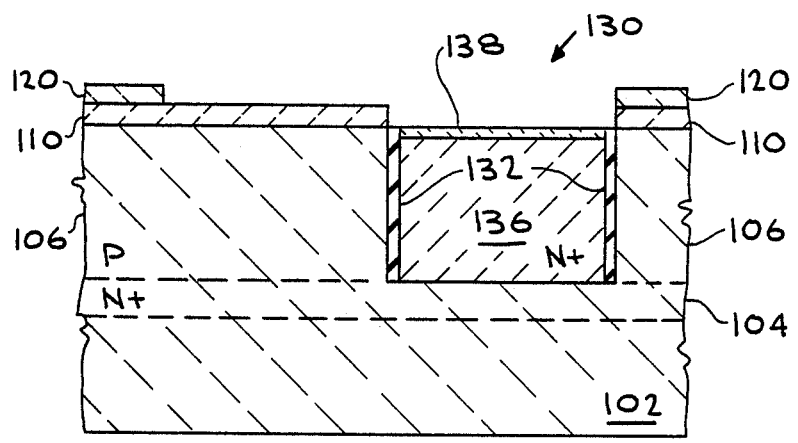

As shown in FIG. 15, after oxide layer 132 and 132a is formed in slot 130, the slot is anisotropically etched to remove bottom portion 132a of the oxide layer. Slot 130 may then be filled with an N+ doped semiconductor material 136 such as a doped polysilicon and an oxide cap 138, which will form a subsequent etch block, may be formed over polysilicon filler material 136.

Figure 16:
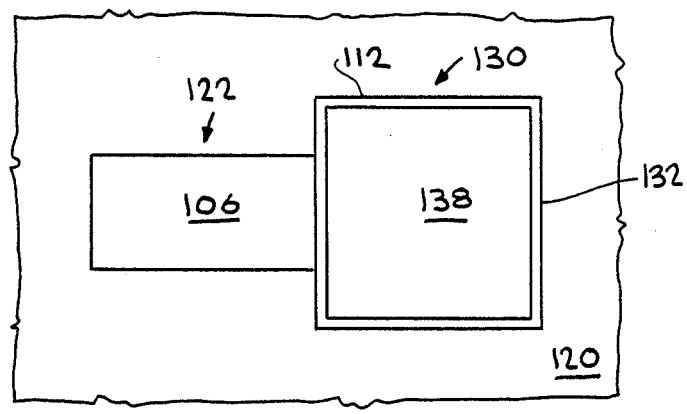
FIG. 16 is a top view of a further step in constructing the second embodiment of the invention.
Figure 17:
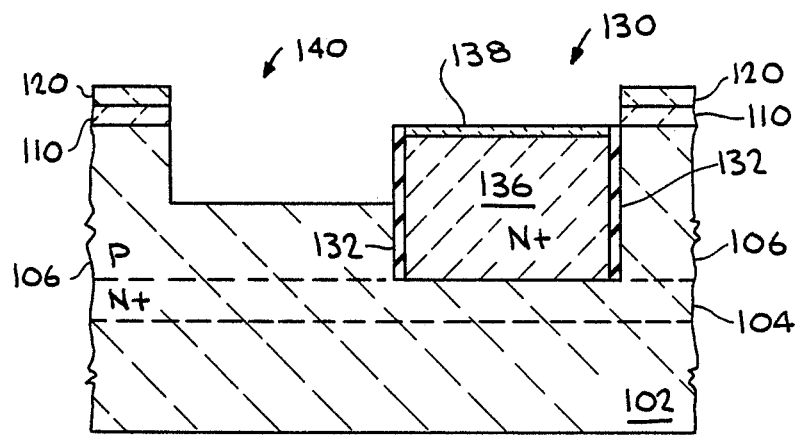
FIG. 17 is a fragmentary vertical cross-sectional view of the structure of FIG. 16.

The portion of nitride layer 110 which is exposed at opening 122 in oxide mask 120 may now be selectively removed to expose the underlying portion of silicon layer 106 as shown in FIG. 16. A second slot 140, is then formed in the substrate by etching layer 106, albeit not as deeply as in the formation of slot 130 as shown in FIG. 17.

Figure 18:
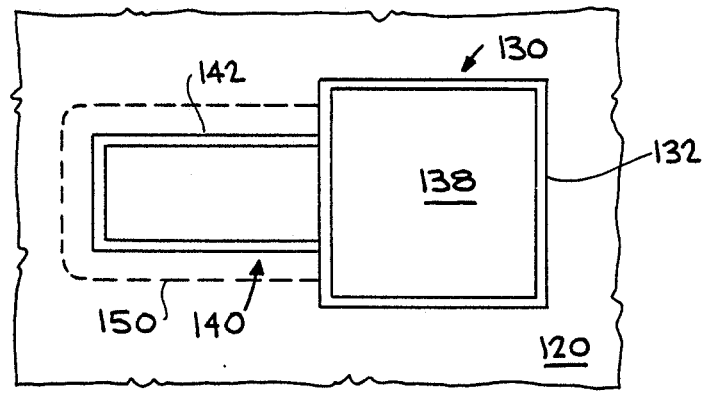
FIG. 18 is a top view of yet a further step in the construction of the second embodiment of the invention.
Figure 19:
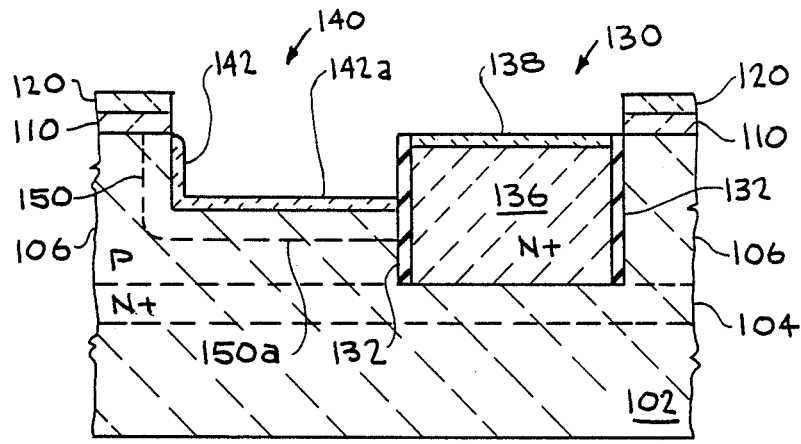
FIG. 19 is a fragmentary vertical cross-sectional view of the structure of FIG. 18.
Figure 20:
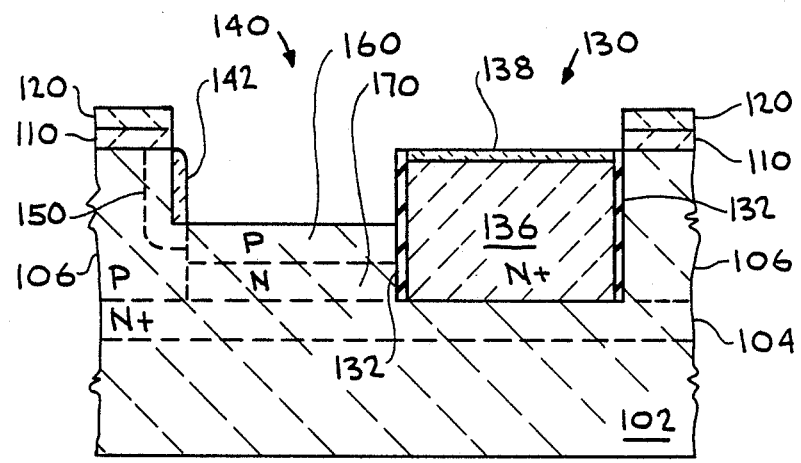
FIGS. 20 and 21 are fragmentary vertical cross-sectional views of subsequent processing steps in the construction of the second embodiment of the invention.
Figure 21:
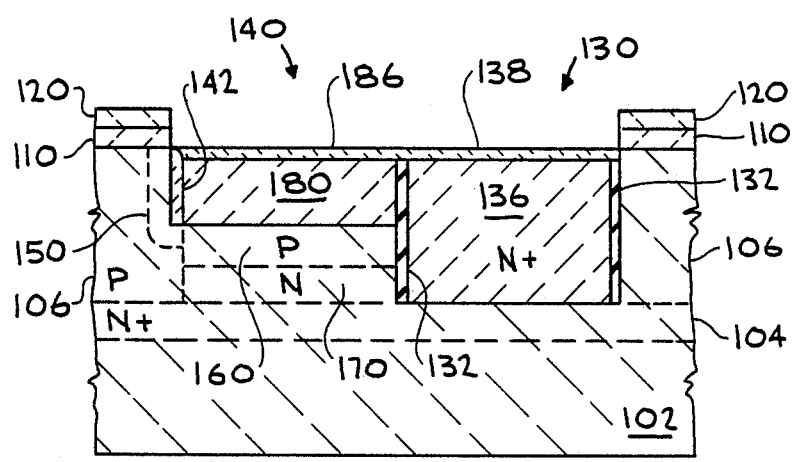

Referring now to FIGS. 18 and 19, after formation of slot 140, the exposed sidewall and bottom of slot 140 are P+ doped by diffusing boron as shown respectively at 150 and 150a. The doped sidewall and bottom are then oxidized at 142 and 142a. The bottom of slot 140 is then etched with a reactive ion etch (RIE) to remove at least oxide portion 142a and optionally all or part of P+ doped 150a beneath oxide 142a.

An N collector region 170 and a P intrinsic base region 160 are now formed in silicon layer 106 beneath the bottom of slot 140 by implantation and diffusion. Arsenic ions, at an energy level of about 180 KeV, are first implanted to provide the N doping for the collector, followed by P doping by implantation of boron ions at an energy level of about 30 KeV to form intrinsic base region 160. Collector region 170 and intrinsic base region 160 are then annealed at about 950° C. for about 30, resulting in the structure shown in FIG. 20.

The remainder of slot 140 may then be filled with N doped polysilicon or SIPOS to form the emitter 180 of the transistor. Finally an oxide cap 186 may be formed over the transistor and contacts may be subsequently opened, respectively to emitter 180, extrinsic base 150, and collector contact 136 using conventional contact forming techniques.

As discussed and illustrated earlier with respect to the MOS device, the just described bipolar merged slot device maybe constructed using the walled slot technique of the previously identified copending application to surround the electrodes with an isolation slot having shared walls with the outwardly facing portions of the merged slot transistor elements.

While the invention has been illustrated with construction of MOS and bipolar devices, the concepts of the invention may be applied to the construction of other active integrated circuit devices as well such as, for example, junction field effect transistors and field clamped bipolar transistors.

FIGS. 22–25 illustrate the concepts of the invention as applied to the construction of a three element merged slot device wherein each of the merged slot portions are formed in independent sequence.

Figure 22:
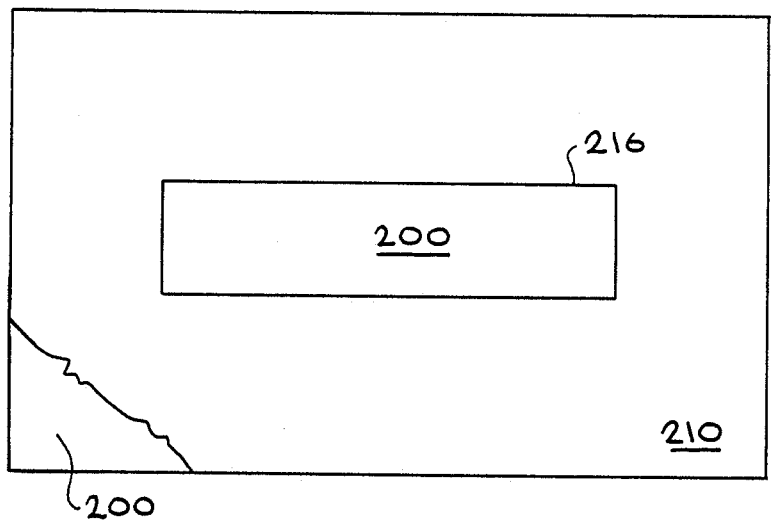
FIGS. 22-25 are top views showing sequential processing steps in yet another embodiment of the invention.
Figure 23:
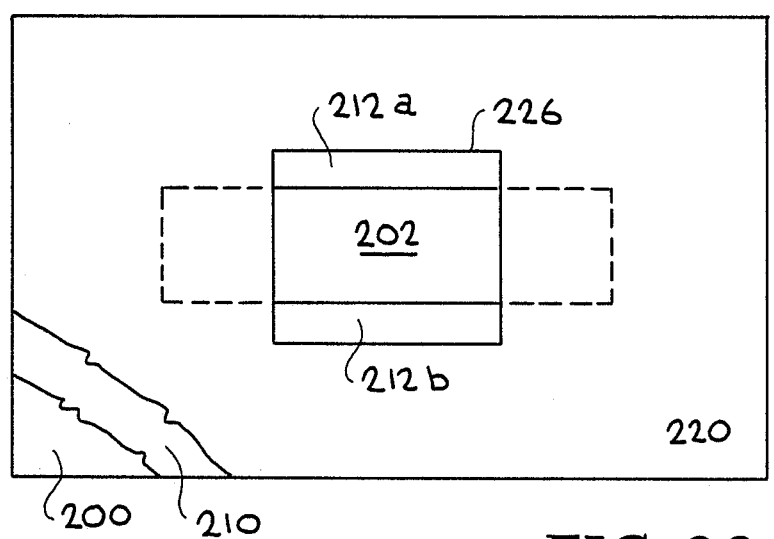

As shown in FIG. 22, a first nitride mask 210 is provided with an opening 216 through which portion 200 of the underlying substrate is visible. An oxide mask 220 is formed over nitride mask 210 with an opening 226 through which prtions 212a and 212b of nitride mask 210 are visible as is segment 202 of substrate portion 200 which again, for purposes of illustration will be assumed to be silicon.

The first slot segment may now be formed by etching exposed segment 202 of substrate 200 through nitride mask 210 and oxide mask 220. After etching and processing this first slot portion in accordance with previously described procedures including refilling of the slot with polysilicon and oxidizing the polysilicon filler, the contiguously adjoining slot portions may be sequentially formed.

Figure 24:
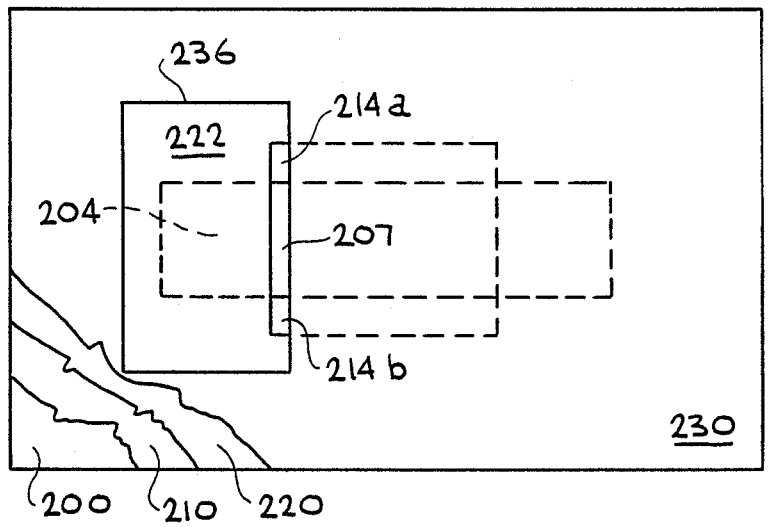

To form these subsequent portions of the merged slot independently, a first polysilicon mask 230 is formed over oxide mask 220 as shown in FIG. 24 by first depositing a polysilicon layer and then patterning it using a photoresist mask as is well known to those skilled in the art. This polysilicon mask is provided with an opening 236 which is large enough to slightly overlap the newly formed slot portion and expose a small portion 207 of the oxide formed over the polysilicon filler material in the first slot portion, as well as to overlap sections 214a and 214b of nitride mask 210. The remainder of mask opening 236 in polysilicon mask 230, however, exposes portion 222 of underlying oxide mask 220.

The second slot portion, then may be formed by first using a selective oxide etch, e.g., a reactive ion etch (RIE) through polysilicon mask 230 to remove the exposed oxide mask portion 222 which will, in turn, expose substrate portion 204 defined by nitride mask 210. This oxide etch will also remove oxide portion 207 over the edge of the already formed first slot portion so that subsequent etching of the silicon substrate will also etch a slight portion of the polysilicon filler in the first slot portion thus ensuring contiguity between the slot portions. This second slot portion is then etched with a silicon etch, which at the same time will remove the no longer needed polysilicon mask 230. This second portion of the merged slot is then suitably processed as in the previous embodiment, including filling of the slot portion.

Figure 25:
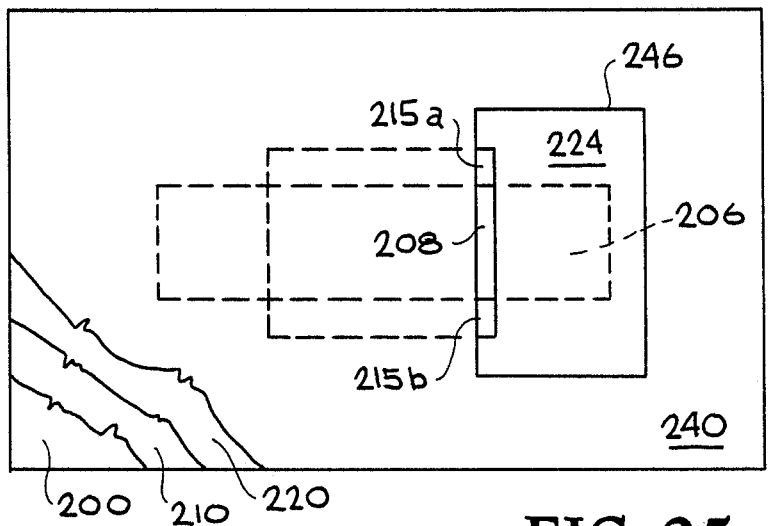

Referring now to FIG. 25, the third or last merged slot portion may now be formed using yet another polysilicon mask layer 240. Polysilicon mask 240 is applied to the structure after completion of the processing of the second slot portion of the merged slot including removal of mask layer 230. Polysilicon layer 240 masks the entire second slot portion and most of the first slot portion except for a slight overlap which exposes oxide segment 208 of the first slot portion and segments 215a and 215b of nitride mask 210.

As in the case of mask 230, the majority of the underlying material exposed by opening 246 in polysilicon mask 240 will be the underlying oxide mask 220. To form the third merged slot portion, exposed oxide layer segment 224 is first etched away, together with oxide portion 208, with a selective oxide etchant. This exposes segment 206 of the underlying substrate through nitride mask 210 as well as the edge of the polysilicon filler in the first slot uncovered by the removal of oxide portion 208.

The third slot portion may now be formed similarly to the formation of the second slot portion by etching the silicon substrate through the nitride mask and then processed to form the third element of the merged slot active device followed by final conventional processing including installation of contacts.

Thus, the invention provides an improved integrated circuit structure and method of making same wherein the elements of an active device are constructed within contiguous or merged portions of a single slot formed in an integrated circuit structure which maximizes the conservation of lateral area as well as, in some cases, improving the performance of the resulting device.

Having thus described the invention, what is claimed is:

1. A method for forming an improved integrated circuit structure with an active integrated circuit device formed in a single slot in the structure or substrate which comprises:
   (a) forming a first portion of said slot in said substrate;
   (b) constructing at least a part of one element of said active device in said slot;
   (c) forming at least one additional slot portions in said substrate contiguous with said first slot portion; and
   (d) constructing at least a part of at least one additional element of the same active device in said additional slot portion.

2. The method of claim 1 including the step of insulating at least the sidewall of said first slot portion to electrically isolate said integrated circuit element constructed therein from elements subsequently constructed in contiguous portions of said slot.

3. The method of claim 2 which further comprises the steps of: forming a gate electrode in said first slot portion; forming contiguous slot portions on opposite sides of said first slot portion containing said gate electrode; and forming source and drain electrodes respectively in said contiguous slot portions on opposite sides of said first slot portion containing said gate electrode; whereby said insulated walls of said first slot portion comprise a gate oxide to separate said gate electrode from said subsequently formed source and drain electrodes in contiguous portions of said slot.

4. The process of claim 2 including the further steps of forming a collector contact in said first slot portion extending to a buried layer beneath said first slot; forming an extrinsic base region in a portion of the wall of said additional slot portion contiguous with said first slot portion; insulating said wall portion having said extrinsic base portion formed therein; forming a collector region beneath said additional slot portion extending down to said buried layer; forming an intrinsic base region in the bottom of said additional slot portion in contact with said extrinsic base region; and forming an emitter in said additional slot portion; whereby said insulation in said first slot portion separates said collector contact in said first slot portion from said emitter.

5. The process of claim 1 including the steps of forming a third slot portion in said substrate contiguous with at least one of the first two slot portions; and forming at least a part of a third element of said active device in said third slot portion.

6. A process for forming an active device in a contiguous slot formed in an integrated circuit structure which comprises:
   (a) forming a first mask layer having an opening therein conforming spacially to at least the cross-sectional area of one or more portions of a slot to be formed in said structure;
   (b) forming a second mask layer over said first mask layer, said second mask layer having an opening therein, which overlaps said opening in said first mask, said opening in said second mask conforming spacially to at least the cross-sectional area of at least one or more portions of a slot to be formed in said structure, including a portion in common with said first mask opening;
   (c) forming a first portion of said slot through said first and second mask openings;
   (d) filling said first portion of said slot with material which will form one portion of said active device;
   (e) forming an etch block layer over said material in said first portion of said slot;
   (f) forming a second portion of said slot through said first and second mask layers contiguous with said first slot portion; and
   (g) filling said second slot portion with material to form another portion of said active device.

7. The process of claim 6 wherein said steps of respectively forming said first and second portions of said slot in said integrated circuit structure comprise etching steps.

8. The process of claim 7 wherein said step of forming said second portion of said slot by etching said integrated circuit structure through said masks further comprises simultaneously etching two spaced apart segments of said integrated circuit structure which are each contiguous with said first portion of said slot.

9. The process of claim 8 wherein said process further comprises the step of forming an insulation layer on the sidewalls of said first portion of said slot after said step of forming said first portion of said slot by etching said integrated circuit structure through said masks whereby said material in said second portion of said slot will be insulated from material in the first portion of said slot by said insulation layer.

10. The process of claim 6 wherein said first mask and second mask comprises different materials to permit selective etching through either mask and to permit independent removal of either mask.

11. The process of claim 10 including the further step of forming a third mask of a different material from said first and second masks and using said third mask in conjunction with said first and second masks to form three contiguous portions of a merged slot.

12. The process of claim 7 including the further steps of: forming at least one additional mask to cover one portion of said slot and at least a part of another portion of said slot; and forming a third portion of said slot contiguous with at least one other portion of said slot by etching said integrated circuit structure.

13. The process of claim 12 wherein the opening in one of said masks has an area generally conforming to three portions of said slot and said another of said masks has an opening conforming to at least one of said slot portions.

14. A method of making a merged slot MOS device in contiguous portions of a slot in a substrate comprises:
   (a) forming a first mask over an integrated circuit substrate having an opening therein;
   (b) forming a second mask over said first mask, said second mask having an opening therein larger than one dimension of said opening in said first mask;
   (c) forming a first slot portion in said substrate through said openings in said first and second masks;
   (d) forming an insulation layer on the walls of said first slot portion;
   (e) filling the remainder of said first slot portion with a material capable of serving as a gate electrode;
   (f) forming an oxide cap over said material in said first slot portion;
   (g) selectively removing exposed parts of said first mask layer on opposite sides of said first slot portion;
   (h) forming second and third slot portions in said substrate respectively contiguous with opposite ends of said first slot portion through the remaining segments of said mask openings; and
   (i) filling said second and third slot portions with material capable of serving respectively as source and drain electrode material.

15. The process of claim 14 wherein said first mask is a nitride mask and said second mask is an oxide mask.

16. The process of claim 14 wherein said first mask is an oxide mask and said second mask is a nitride mask.

17. The method of claim 14 wherein said step of forming said first mask layer includes the step of forming an opening therein having dimensions which generally defining the lateral dimensions of the gate electrode and gate oxide.

18. The process of claim 14 wherein said step of forming said second mask includes lthe step of forming an opening therein which is sufficiently larger than said opening in said first mask to also define the lateral dimensions of the source and drain electrodes to be formed in said substrate.

19. The method of claim 18 wherein said step of forming an insulation layer on the walls of said first slot portion further comprises forming an oxide layer on the walls of said first slot portion to provide a gate oxide which will insulate said gate electrode from said source and drain electrodes and from channels subsequently formed in said substrate between said source and drain electrodes.

20. The process of claim 19 wherein said step of forming said first slot portion further comprises etching said slot in a silicon substrate and said step of forming said said oxide layer on the walls of said first slot portion to provide a gate oxide further comprises the step of oxidizing said silicon walls of said first slot portion to form said gate oxide.

21. The method of forming an improved integrated circuit structure with an active integrated circuit device formed in a single vertical slot in the substrate which comprises:
   (a) forming a first vertical portion of said vertical slot in said substrate;
   (b) constructing at least one part of one element of said active device in said first slot portion;
   (c) subsequently forming at least one additional vertical slot portion in said substrate having at least a part of a sidewall contiguous with at least a portion of the original sidewall of said first vertical slot portion; and constructing at least a part of at least one additional element of the same active device in said additional vertical slot portion; ps whereby the contiguous formation of said vertical slot portions adjacent one another maximizes the conservation of lateral area.

* * * * *